United States Patent
Bridger

(10) Patent No.: US 8,120,139 B2
(45) Date of Patent: Feb. 21, 2012

(54) VOID ISOLATED III-NITRIDE DEVICE

(75) Inventor: Paul Bridger, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 634 days.

(21) Appl. No.: 11/004,146

(22) Filed: Dec. 3, 2004

(65) Prior Publication Data
US 2005/0142810 A1 Jun. 30, 2005

Related U.S. Application Data

(60) Provisional application No. 60/527,635, filed on Dec. 5, 2003.

(51) Int. Cl.
*H01L 29/00* (2006.01)
(52) U.S. Cl. .............. 257/509; 257/11; 257/28; 257/51; 257/499; 257/E23.025; 257/E21.206; 117/952
(58) Field of Classification Search ............ 257/20, 257/24, 194, 213, 11, 28, 51, 499, 509, E23.025, 257/E21.206; 117/952
See application file for complete search history.

(56) References Cited

U.S. PATENT DOCUMENTS

| | | | |
|---|---|---|---|
| 6,673,646 B2 * | 1/2004 | Droopad | 438/85 |
| 2002/0070383 A1 | 6/2002 | Shibata | |
| 2003/0017633 A1 | 1/2003 | Doi | |

FOREIGN PATENT DOCUMENTS

| | | |
|---|---|---|
| JP | 8-203862 | 8/1996 |
| JP | 8203862 | 8/1998 |
| JP | 2002-231705 | 8/2002 |
| JP | 2002231705 | 8/2002 |
| WO | WO 97/41591 | 11/1997 |

OTHER PUBLICATIONS

Namkoong et al, Low Temperature Nitridation Combined With High Temperature Buffer Annealing for High Quality GaN Grown by Plasma-Assisted MBE, 2000, The Material Research Society, pp. 1-4.*
Marked Up Copy-Figure 10 of US 6,673,646.*
Merriam-Webster Online Dictionary www.m-w.com.*
Dictionary.com www.dictionary.reference.com.*
Youtsey C et al.: "Dopant-Selective Photoenhanced Wet Etching of GaN", Journal of Electronic Materials, vol. 27, No. 4, Apr. 1998, pp. 282-287.

* cited by examiner

*Primary Examiner* — Thanh V Pham
(74) *Attorney, Agent, or Firm* — Farjami & Farjami LLP

(57) ABSTRACT

Isolation of III-nitride devices may be performed with a dopant selective etch that provides a smooth profile with little crystal damage in comparison to previously used isolation techniques. The dopant selective etch may be an electro-chemical or photo-electro-chemical etch. The desired isolation area may be identified by changing the conductivity type of the semiconductor material to be etched. The etch process can remove a conductive layer to isolate a device atop the conductive layer. The etch process can be self stopping, where the process automatically terminates when the selectively doped semiconductor material is removed.

12 Claims, 1 Drawing Sheet

VOID ISOLATED III-NITRIDE DEVICE

RELATED APPLICATION

The present application is based on and claims benefit of U.S. Provisional Application No. 60/527,635, filed Dec. 5, 2003, entitled Electro-Chemical Etch for Device Isolation in III-Nitride Devices to which a claim of priority is hereby made, and the disclosure of which is hereby incorporated herein by reference.

BACKGROUND OF THE INVENTION

1. Field of the Invention

The present invention relates generally to an isolation technique for III-nitride devices, and relates more particularly to a device and method for an electrochemical etch to produce device isolation in III-nitride semiconductor devices.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential.

One of the advantages attained with power semiconductor devices for manufacturing purposes is the ability to produce compact structures on a single wafer or on a single die. A number of III-nitride devices can be formed on a given wafer or die to speed production and increase efficiency. When the devices are formed on a wafer or die, they must be isolated from each other to provide proper independent operation. Accordingly, it would be desirable to produce a number of III-nitride power devices on a single wafer or die with some type of insulation or isolation between the devices.

A drawback of III-nitride devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer such as an insulator, for example, and makes device isolation problematic.

One solution to provide isolation is to add insulation barriers around the device to produce the desired isolation and typical layers used for this purpose are silicon oxide, silicon nitride, saphire, or other insulators, disposed between devices. However, these processes and structures are difficult to implement and are not commercially feasible.

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

Another solution to attain isolation in a III-nitride semiconductor device is through the use of a dielectric. For example, in silicon semiconductors, native oxides are available, such as silicon dioxide, that can serve as a suitable dielectric. However, no equivalent material to the native oxides in silicon is available for suitable dielectrics in the III-nitride material system. Dielectric materials that would otherwise be suitable in silicon semiconductors, for example, do not transfer well to III-nitride devices. For example, if silicon dioxide or silicon nitride were to be used for a dielectric in a III-nitride device, these conventional dielectrics may rupture or otherwise fail. Typically, the large dielectric breakdown field produced in the III-nitride material system causes large electric fields in the III-nitride semiconductor devices that are greater than can be withstood with conventional dielectric materials.

High voltage isolation of devices on a substrate is die is known in which different portions of the semiconductor structure are built to have a voltage well, where the device is constructed in the well and, voltage isolated to a particular voltage level. These isolation wells may be formed with a number of barrier structures to prevent leakage from one potential well to another, but such structures are often complicated and expensive to manufacture.

One way to obtain device isolation in conventional semiconductors is to apply a plasma etch process to the semiconductor material surrounding the devices on the substrate or semiconductor die. However, the plasma etch process induces surface damage and roughness in the semiconductor material, which may nevertheless be acceptable for a number of low power, conventional semiconductor devices. However, surface damage and roughness in the semiconductor material is particularly problematic for high power electronic devices where problems develop with surface breakdown and leakage currents between device structures.

Accordingly, it would be desirable to device an isolation technique for devices on a substrate or a semiconductor die that is simple and inexpensive to implement.

It is also desirable to obtain device isolation without a number of additional steps or the use of additional materials.

Furthermore, it would be desirable to provide a technique for device isolation that produces little or no damage to the semiconductor devices or underlying material.

SUMMARY OF THE INVENTION

According to the present invention, there is provided a technique and resultant structure for isolating semiconductor devices constructed on a single substrate or semiconductor die. In particular, a III-nitride semiconductor device can be isolated by masking or protecting the device and applying an electro-chemical or photo-electro-chemical (PEC) dopant selective etch. The selective material is removed by the etch to isolate the III-nitride device from the semiconductor layer on which the device is produced.

According to an exemplary embodiment of the present invention, the semiconductor material surrounding the device is modified from P-type to N-type, or vice versa, through an ion implantation process. Once the surrounding semiconductor material is modified, it can be selectively removed by application of an etch process. The selective etch produces smooth material profiles with little or no crystal damage when compared with plasma etch techniques. The simple etch process is much less complicated than other isolation techniques, including termination structures or voltage well isolation structures. In addition, the reduction in damage to the semiconductor surface through the selective etch provides reduced leakage currents and prevents or reduces the effects of surface breakdown.

An exemplary device that can benefit from the isolation technique of the present invention is a mesa type schottky rectifier. The technique of selectively etching the semiconductor material around the schottky rectifier device increases the performance of the device and produces higher quality semiconductor fabrication.

The selective etch process produces smooth semiconductor material profiles, making the resulting structures useful for a number of qualities in addition to isolation. For example, structures may be defined for use in optical applications where high quality surfaces are used to generate desired optical effects. One exemplary application that would benefit from the technique of the present invention is the formation of laser facets in a semiconductor material.

Advantageously, cladding and contact layers may be grown above or below the active region. Other known processes for constructing electrodes, insulation layers and so forth may also be applied to the present invention.

According to another feature, the present invention provides a method for forming a III-nitride semiconductor device with a structure on an insulative or highly resistive substrate. Optionally, a buffer layer may be provided between the substrate and a III-nitride body layer, which is preferably composed of GaN. The buffer layer may also be composed of a III-nitride multilayer stack with alternating types of III-nitride materials to form a high current carrying region. A III-nitride layer with a smaller in-plane lattice constant that the underlying layer, preferably AlGaN, is deposited over the body layer. The top layer may then be patterned and etched, to remove particular portions of the top III-nitride layer as desired. Ohmic and/or schottky contacts may be formed atop the smaller in-plane lattice constant III-nitride layer, with appropriate annealing steps to activate the ohmic contacts. Additional cladding or contact layers may be formed in a vertical or horizontal relationship with the active regions. For example, known processes for constructing electrodes and insulation layers may be applied in forming the III-nitride device.

An insulative or protective layer may then be applied over the device in preparation for the selective etch. The insulative or protective layer is formed over the device so that the surrounding semiconductor material is exposed for processing in the selective etch. The semiconductor material surrounding the device is then changed in conductivity type. For example, if the material surrounding the device was P-type, it is changed to N-type and vice versa. The conductivity type may be changed using an ion implantation process or other techniques commonly used for doping semiconductor materials. The modified conductivity type material surrounding the device is then removed using an etch process that selectively removes the changed conductivity material. These processes may include an electro-chemical or photo-electro-chemical dopant selective etch. In accordance with this feature, a number of devices may be easily isolated on the same substrate or die with little or no damage to the crystalline structure of the III-nitride device. In addition, the devices may be interconnected to form desired circuitry using standard connection techniques, so that a single circuit can be formed on a wafer or die.

According to another feature of the present invention, an insulative or protective layer may be placed over the III-nitride device, and used as a mask for the selective conductivity type material change. Other types of material layers or masks, including photoresists may be used in accordance with the present invention.

In accordance with another feature of the present invention, the conductivity type material change of the semiconductor material surrounding the device may take place during one or more of the fabrication steps for producing the device. For example, a topmost layer of a substrate or die may be changed in conductivity type, prior to the completion of a III-nitride device structure. The device structure may then be completed according to a given design, after which it may be overlaid by an insulative or protective layer to permit the selective etch process to take place.

The large dielectric breakdown field in the III-nitride semiconductor material system permits the construction of power devices with reduced size standoff regions. The material system also permits the production of devices with reduced specific on resistance in comparison with known devices of similar voltage ratings. Due to the higher performance of the III-nitride semiconductor material, in a smaller size than traditional materials, device isolation takes on a greater importance. The device isolation provided according to the present invention can provide improved performance suitable for the III-nitride semiconductor materials, where such isolation was not needed or recognized in silicon semiconductors due to the lower electric fields generated by devices during operation.

The present invention is also characterized by low leakage currents and better resistance to surface breakdown. As a result, the present invention permits much denser construction of devices, potentially increasing wafer yields. The high critical fields of the III-nitride materials allow thin layers to withstand large voltages without dielectric breakdown. For example, the dielectric constant of GaN materials is approximately 10, which is a factor of 2.5 times better than silicon counterparts.

In accordance with another aspect of the present invention, a III-nitride semiconductor surface may be passivated or repassivated according to a self passivation effect. This technique may be used to enhance the isolation of devices according to the present invention.

The self passivation provides a high electric field breakdown. According to a feature of the present invention, the surface passivation includes a nitrogen plasma anneal. In accordance with another feature of the present invention, the passivation process includes using an encapsulant material containing nitrogen followed by an anneal. According to a further feature of the present invention, the passivation may be performed with a photo-electro-chemical etch.

According to another feature of the present invention, the dopant selective etch applied to remove semiconductor material to isolate devices is a self terminating etch process. The etch process operates on dopant selective material due to a difference in charge between the selected doped material and the material that is to remain after the etch process completes. Accordingly, the etch process is self terminated after all the dopant selective material has been removed. This type of process permits greater control in establishing the isolation of the devices, and permits the etch process to be used in a number of the sequences used to form the III-nitride semiconductor device. For example, the wafer surface may be patterned with the dopant material prior to the formation of the III-nitride device structure, and etched at that point or after the formation of the III-nitride device structure. In addition, the etch may be performed with little or no protection provided to the device, since the exposed portions of the device are not effected by the dopant selective etch.

Other features and advantages of the present invention will become apparent from the following description of the invention which refers to the accompanying drawings.

DETAILED DESCRIPTION OF THE PREFERRED EMBODIMENTS

Figure 1A:
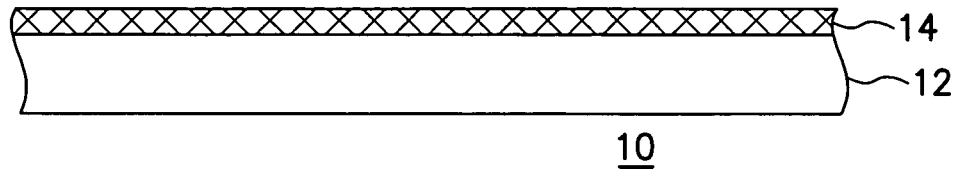
FIG. 1A is a cross-sectional view of a III-nitride material layer stack.

The advantages of III-nitride materials in conducting large amounts of current and withstanding high voltage are typically realized in a GaN/AlGaN layer construction, although other types of constructions may readily be used in the III-nitride material system. For example, whenever two different materials in the III-nitride material system have different in-plane lattice constants, such that a high mobility interface is formed between the two layers, the advantages of high blocking current and high current conduction in devices constructed with the interface are readily observed.

It is often the case that III-nitride material semiconductor devices are formed on a wafer level, where a number of devices may be fabricated at the same time. Accordingly, a substrate is often used as a base upon which the III-nitride semiconductor devices may be formed, where the devices are composed of a buffer layer and/or a body layer with different composition III-nitride materials. Often, portions of the body layer are overlaid with the III-nitride material having a different in-plane lattice constant, to form the desired high mobility conduction channel between the body layer and the overlaid barrier layer. When this operation occurs on wafer wide level, additional operations are often performed to provide the proper isolation between various devices constructed on the wafer. That is, isolation of devices on the wafer entails destroying at least a portion of the high mobility conduction layer or the crystalline structure surrounding the device to prevent leakage currents and resist surface breakdown that may cause improper device operation or failure. The destruction of the high mobility channel or crystalline structure must also be achieved to dampen the high electric fields that may be generated by the III-nitride devices when a number of devices are constructed on a same die, or otherwise constructed as a single unit, but isolated from each other.

Previously, a plasma etch process was used to remove portions of the III-nitride material surrounding the device to be isolated, so that a highly resistive or insulative barrier is formed between devices. The plasma etch process removes enough III-nitride material to expose a highly resistive or insulative layer surrounding the device, so that little or no leakage current is produced by the device. In addition, the plasma etch process removes enough III-nitride material, with a dimension that dampens the electric field that is generated by the III-nitride device during operation so that adjoining devices are not impacted. The plasma etch process also contributes to reducing or eliminating surface breakdown that may occur during operation of the III-nitride device.

One of the difficulties with the plasma etch process is the imprecision with which the process removes material from the substrate or die being processed. For example, the plasma etch process can induce surface damage and roughness in the material remaining after the etch process has removed the desired amount of material. The perimeter portions of the III-nitride device subjected to the plasma etch process accordingly has some induced surface damage and roughness, meaning that the crystalline structure is damaged and somewhat irregular. In previous applications, when III-nitride devices were used in low power applications, for example, the perimeter roughness or crystalline damage was inconsequential. However, for high power electronic devices, that are susceptible to surface breakdown and the generation of leakage currents, the damage to the crystalline structure and the surface roughness are highly undesirable. For instance, the roughness of material in the III-nitride high power electronic device may lead to the generation of high electric fields at the points of roughness, leading to surface breakdown and leakage currents in the device.

Referring now to FIG. 1A, a structure and method in accordance with the present invention is illustrated with respect to III-nitride material stack 10. Stack 10 includes a body layer 12 and a doped upper layer 14. Preferably, layers 12 and 14 are composed of GaN. Stack 10 is representative of a typical III-nitride device, where body layer 12 may be composed of one or more layers of III-nitride material, or other composites or alloys, including substrates, such as silicon, silicon carbide, sapphire and so forth. Layer 12 may also be a composite layer with graded alloy material composed of any of the III-nitride materials, for example. Layer 12 may include a doped region for current conduction with an N or P-type doping. Alternately, or in addition, layer 12 may be composed of a highly resistive or insulative material that can act to prevent leakage currents or the propagation of electric fields that can lead to surface breakdown.

Layer 14 of stack 10 is composed of highly doped III-nitride material, and provides a conduction layer for carrying current for later formed devices on stack 10. Layer 14 may be doped with P or N-type material and configured to carry current with devices constructed and specified in accordance with the type of material selected for constructing layer 14. For example, a P channel device constructed on layer 14 would indicate that layer 14 is doped with P-type material.

Figure 1B:
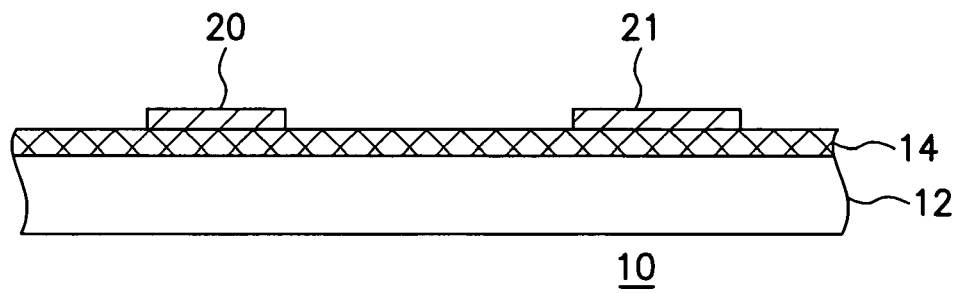
FIG. 1B is the stack of FIG. 1A further including III-nitride devices.

Referring now to FIG. 1B, devices 20, 21 are constructed on layer 14. Devices 20, 21 may be constructed using N or P-type material, based on the choice of dopant material used to form layer 14, for example. Any type of devices may be constructed and benefit from the present invention, including FETs, rectifiers, schottky diodes and so forth.

Figure 1C:
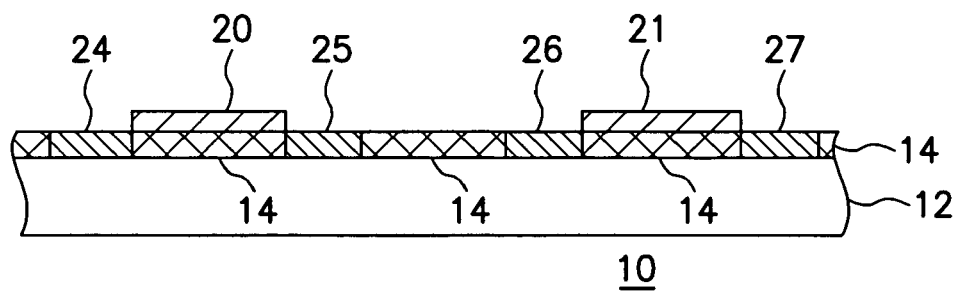
FIG. 1C is the stack of FIG. 1B including selectively doped material according to the present invention.

Referring now to FIG. 1C, portions 24-27 of stack 10 are changed in conductivity type to have the opposite conductivity type. Accordingly, if layer 14 had conductivity type P, portions 24-27 are changed to N-type material, for example. This step may be achieved according to a number of different techniques, including the use of a mask with an ion implantation, for example. The mask may be achieved according to a number of different techniques, and may include a protective layer over devices 20, 21. The dimensions of portions 24-27 may be adjusted according to the desired device characteristics with respect to isolation. For example, if a greater degree of isolation is desired, the dimensions of portions 24-27 may be increased. By changing the conductivity type of portions 24-27, these areas are targeted for the dopant selective etch process applied according to the present invention.

Once portions 24-27 of stack 10 are changed in conductivity type, a dopant selective etch is applied to stack 10. The dopant selective etch targets portions 24-27 for removal, and etches those portions of layer 14 where the conductivity type has been changed. The applied etch process may be an electro-chemical etch, or a photo-electro-chemical etch. These types of etch processes are active when the material to be etched has a different charge than the surrounding device due to the presence of the dopant marking the material to be etched. Accordingly, the etch process can be self stopping or terminating, as etching takes place only as long as the dopant material remains in portions 24-27. Once all of the doped material in portions 24-27 has been etched, the etch process automatically stops in the absence of any charge difference related to the dopant selected material. Through the use of this feature, a number of intricate structures can be constructed, where some portions would ordinarily have taken longer to etch, meaning that a longer etch process may cause damage to other, quickly etched portions of a wafer or die. Thus, the dopant selective etch can be used in intricate patterns for a long period of time without causing damage to the remainder of the wafer or die structure.

Figure 1D:
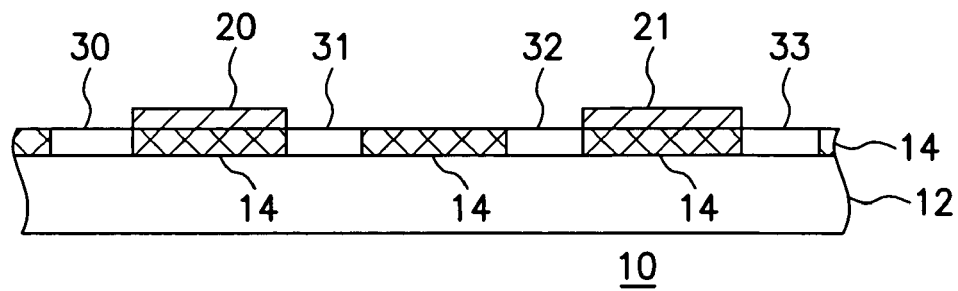
FIG. 1D is the stack of FIG. 1C with the doped material removed.

Referring now to FIG. 1D, stack 10 includes voids 30-33 that are the result of the removal of portions 24-27 using the dopant selective etch. Voids 30-33 provide isolation for devices 20-21, and prevent leakage currents in stack 10 or between devices 20, 21. Voids 30-33 eliminate a conduction path for any charge that may be generated by devices 20, 21. Accordingly, devices 20, 21 may develop high electric fields, without causing surface breakdown in stack 10. If desired, voids 30-33 may be filled with a suitable dielectric material, or passivated to provide additional isolation protection.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An isolation structure for a III-nitride device, comprising:
   a base layer having insulative properties and a planar top surface;
   a first III-nitride layer overlying the planar top surface of the base layer;
   a second III-nitride conductive layer overlying the planar top surface of the base layer and disposed lateral to the first III-nitride layer;
   a III-nitride semiconductor device atop the second III-nitride conductive layer; and
   an isolation void disposed between the first III-nitride layer and the second III-nitride conductive layer;
   a portion of the planar top surface under the first III-nitride layer and the second III-nitride conductive layer comprising a bottom of the isolation void, wherein the void is formed using a dopant selective etch, and wherein the base layer is comprised of a material selected from a group consisting of GaN, Si, SiC, and Sapphire.

2. The structure according to claim 1, wherein the dopant selective etch is an electro-chemical etch.

3. The structure according to claim 1, wherein the dopant selective etch is a photo-electro-chemical etch.

4. An isolation structure for a III-nitride device, comprising:
   a base layer having a planar top surface;
   a first III-nitride layer overlying the planar top surface of the base layer;
   a second III-nitride conductive layer overlying the planar top surface of the base layer and disposed lateral to the first III-nitride layer;
   a III-nitride semiconductor device on the second III-nitride conductive layer; and
   an isolation void disposed between the first III-nitride layer and the second III-nitride conductive layer;
   a portion of the planar top surface under the first III-nitride layer and the second III-nitride conductive layer comprising a bottom of the isolation void.

5. The structure according to claim 4, wherein the void is formed using a dopant selective etch.

6. The structure according to claim 4, wherein the void is formed using an electro-chemical etch.

7. The structure according to claim 4, wherein the void is formed using a photo-electro-chemical etch.

8. The structure according to claim 4, wherein the base layer is comprised of a material selected from a group consisting of GaN, Si, SiC, and Sapphire.

9. The structure according to claim 4, wherein the second III-nitride conductive layer is on the planar top surface of the base layer.

10. The structure according to claim 4, wherein the first III-nitride layer is on the planar top surface of the base layer.

11. The structure according to claim 4, wherein the base layer has insulative properties.

12. The structure according to claim 4, wherein the second III-nitride conductive layer provides a conduction layer for carrying current in the III-nitride semiconductor device.

* * * * *